United States Patent
Uchida

(10) Patent No.: US 9,928,866 B2
(45) Date of Patent: Mar. 27, 2018

(54) METHOD FOR MANUFACTURING MAGNETIC RECORDING MEDIUM

(71) Applicant: FUJI ELECTRIC CO., LTD., Kawasaki-shi (JP)

(72) Inventor: Shinji Uchida, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 973 days.

(21) Appl. No.: 13/741,144

(22) Filed: Jan. 14, 2013

(65) Prior Publication Data

US 2013/0186742 A1 Jul. 25, 2013

(30) Foreign Application Priority Data

Jan. 19, 2012 (JP) ................. 2012-009323

(51) Int. Cl.
| | | |
|---|---|---|
| *C23C 14/34* | (2006.01) | |
| *G11B 5/84* | (2006.01) | |
| *G11B 5/65* | (2006.01) | |
| *G11B 5/851* | (2006.01) | |
| *C23C 14/56* | (2006.01) | |

(52) U.S. Cl.
CPC ............ *G11B 5/84* (2013.01); *C23C 14/34* (2013.01); *C23C 14/3414* (2013.01); *C23C 14/3464* (2013.01); *C23C 14/568* (2013.01); *G11B 5/65* (2013.01); *G11B 5/851* (2013.01)

(58) Field of Classification Search
CPC .. G11B 5/84; G11B 5/65; G11B 5/851; C23C 14/14; C23C 14/34; C23C 14/568
USPC ......................................... 204/192.2, 298.26
See application file for complete search history.

(56) References Cited

U.S. PATENT DOCUMENTS

| | | | | |
|---|---|---|---|---|
| 4,833,020 A | | 5/1989 | Shiroishi et al. | |
| 4,894,133 A | * | 1/1990 | Hedgcoth | G11B 5/64 204/192.15 |
| 5,244,554 A | * | 9/1993 | Yamagata | C23C 14/568 156/345.33 |
| 5,562,982 A | * | 10/1996 | Hiwatashi | G11B 5/72 428/332 |
| 5,616,370 A | * | 4/1997 | Okuno | B82Y 25/00 204/192.2 |
| 5,683,561 A | * | 11/1997 | Hollars | H01J 37/3405 204/298.03 |
| 5,993,956 A | | 11/1999 | Lambeth et al. | |

(Continued)

FOREIGN PATENT DOCUMENTS

| | | |
|---|---|---|
| JP | 63-187416 A | 8/1988 |
| JP | 03-063921 A | 3/1991 |

(Continued)

OTHER PUBLICATIONS

Japanese Office Action with translation dated Nov. 4, 2015.

*Primary Examiner* — John J Brayton
(74) *Attorney, Agent, or Firm* — Rabin & Berdo, P.C.

(57) ABSTRACT

A method for manufacturing a magnetic recording medium includes reducing and eliminating impurity gas present in a chamber. A magnetic recording layer is formed and an active material layer is also formed immediately below or immediately above the magnetic recording layer in respective chambers. The active material layer is formed in the same chamber or with a gate opened between the magnetic recording layer chamber and the active material layer chamber.

18 Claims, 7 Drawing Sheets

(56) References Cited

U.S. PATENT DOCUMENTS

| | | | | |
|---|---|---|---|---|
| 6,071,607 | A * | 6/2000 | Okuyama | G11B 5/64 |
| | | | | 204/192.2 |
| 7,220,500 | B1 * | 5/2007 | Tomiyasu | G11B 5/455 |
| | | | | 428/831 |
| 8,014,104 | B2 | 9/2011 | Cheng et al. | |
| 2001/0036564 | A1 | 11/2001 | Ohmori | |
| 2002/0150796 | A1 | 10/2002 | Kanbe et al. | |
| 2011/0011733 | A1 * | 1/2011 | Yang | C23C 14/025 |
| | | | | 204/192.2 |
| 2013/0170075 | A1 * | 7/2013 | Dai | G11B 5/65 |
| | | | | 360/244 |

FOREIGN PATENT DOCUMENTS

| | | |
|---|---|---|
| JP | 2001-234326 A | 8/2001 |
| JP | 2001-291230 A | 10/2001 |
| JP | 2001-522504 A | 11/2001 |
| JP | 3318204 B2 | 8/2002 |
| JP | 2003-036525 A | 2/2003 |
| JP | 2003-313659 A | 11/2003 |
| JP | 2004-039082 A | 2/2004 |
| JP | 2008-234828 A | 10/2008 |
| JP | 2010106290 A | 5/2010 |
| WO | WO 98-06093 A1 | 2/1998 |

\* cited by examiner

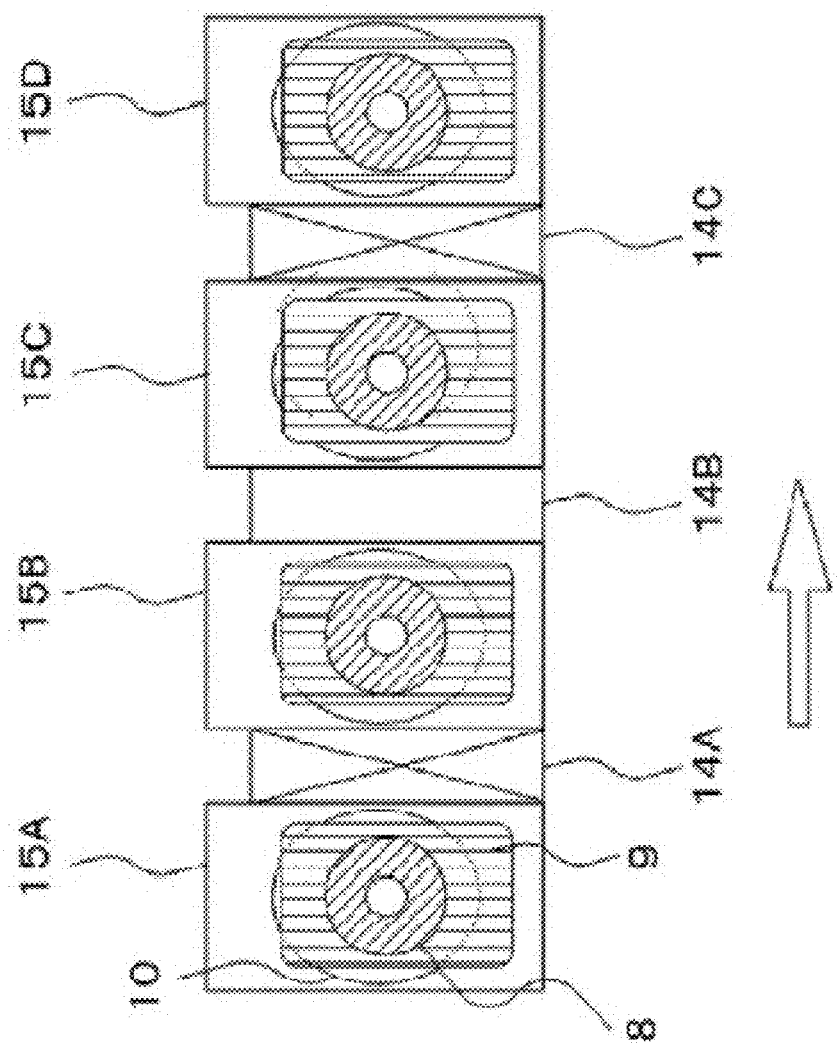

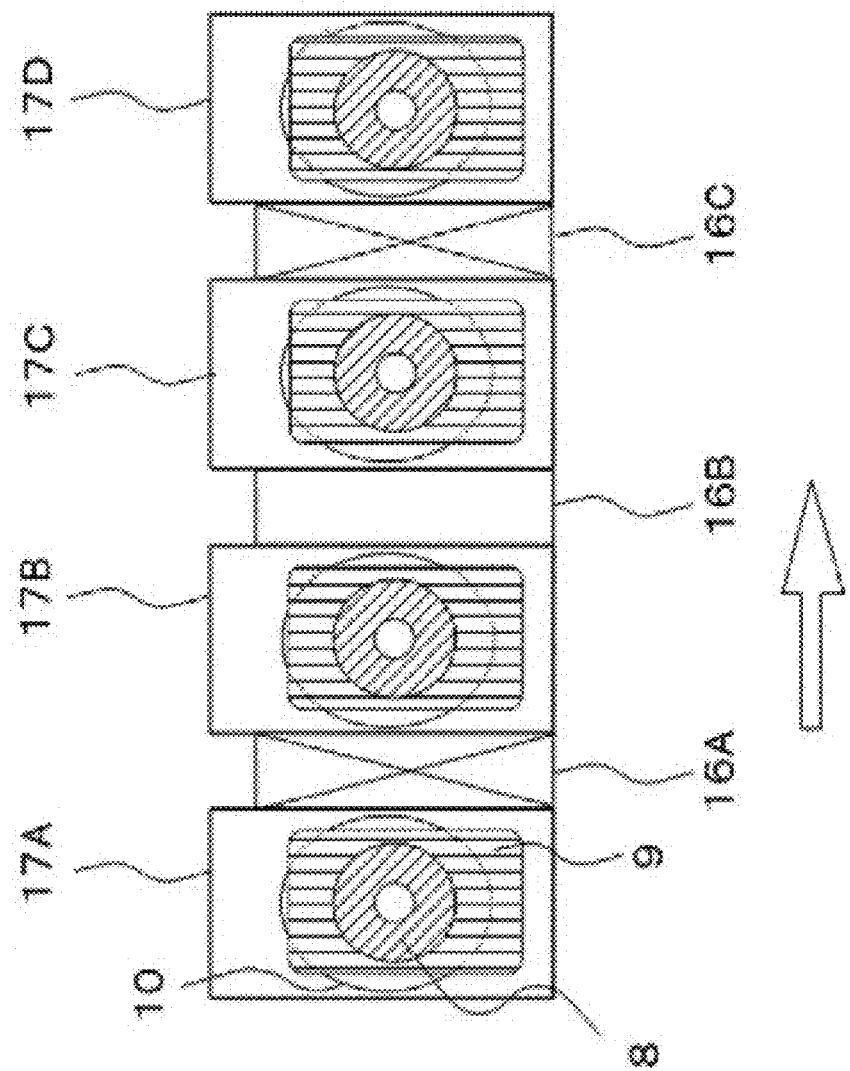

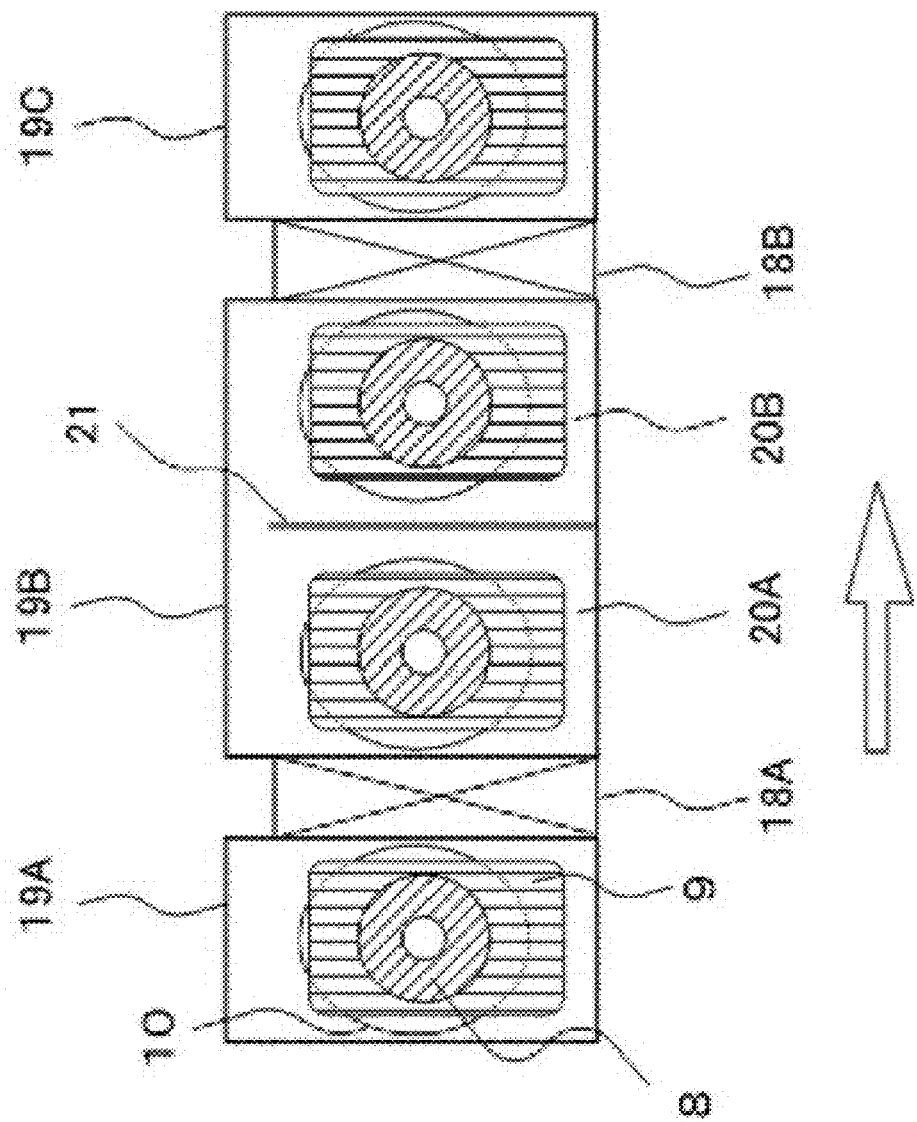

METHOD FOR MANUFACTURING MAGNETIC RECORDING MEDIUM

CROSS-REFERENCE TO RELATED APPLICATION

This application claims the benefit of priority of Japanese patent application number 2012-009323, filed on Jan. 19, 2012, the disclosure of which is incorporated herein by reference.

BACKGROUND OF THE INVENTION

Field of the Invention

The present invention relates to a method for manufacturing a magnetic recording medium.

Description of the Related Art

A perpendicular magnetic recording system has been adopted as a technology for increasing the recording density of a magnetic recording medium. A medium recorded magnetically by this system (a perpendicular magnetic recording medium) has a nonmagnetic substrate formed from a nonmagnetic material, an underlayer, a magnetic recording layer, a protective layer for protecting the surface of the magnetic recording layer, and a liquid lubricant layer. The medium sometimes further has a soft magnetic under layer that is formed from a soft magnetic material and plays the role of concentrating a magnetic flux generated by a magnetic head onto the magnetic recording layer.

As a magnetic recording layer of a perpendicular magnetic recording medium, there is proposed a magnetic recording layer having a granular structure in which a nonmagnetic substance such as $SiO_2$ or $TiO_2$ is added to an alloy material such as CoCrPt or CoCrTa (granular magnetic recording layer) (Japanese Patent Application Publication No. 2001-291230). In a CoCrPt—$SiO_2$ granular magnetic recording layer, for example, a $SiO_2$ nonmagnetic substance is segregated around CoCrPt magnetic crystal grain and separates the individual CoCrPt magnetic crystal grain magnetically. In addition, a stacked body with a plurality of magnetic recording layers or an exchange-coupled composite (ECC) structure having an exchange-coupling control layer inserted between magnetic recording layers, is used in the perpendicular magnetic recording medium. Stacking a plurality of magnetic recording layers provides the effect of reducing magnetic switching loss while ensuring thermal stability. Note that each of the magnetic recording layers here is a single layer. Furthermore, in recent years, for the purpose of making up for a reduction in thermal stability, $L1_0$-ordered alloy (Strukturbericht designation) such as CoPt or FePt has been proposed as a material with higher magnetocrystalline anisotropy (Ku) (Japanese Patent Publication No. 3318204). An underlayer plays an important role in formation of a $L1_0$-ordered alloy layer. This is because crystals of $L1_0$-ordered alloy need to have a (001) orientation (a [001] axis of each crystal is positioned perpendicularly to a film surface) in order to provide magnetic crystal grain with a high magnetocrystalline anisotropy. In so doing, MgO having high lattice matching with the $L1_0$-ordered alloy is generally used as the underlayer.

In this manner, granular structure control, exchange-coupling control between magnetic recording layers, crystalline orientation control with lattice matching using an underlayer, and other advanced control are performed on each magnetic recording layer in order to improve the performance of the magnetic recording medium, requiring further improvement of the quality of each magnetic recording layer.

A magnetic recording layer is generally formed using a vacuum deposition equipment such as a sputtering/deposition/CVD equipment. It is effective to remove, as much as possible, impurity gas such as $H_2O$, $O_2$, $H_2$, CO, $CO_2$ and the like remaining in a vacuum in order to further improve the quality of the generated magnetic recording layer. Among the conventional semiconductors, there is proposed a getter pump for absorbing impurity gas inside a vacuum chamber of a vacuum deposition equipment by using an active material such as Ti to improve the quality of a generated film. The getter pump heats and thereby evaporates a filament made of an active material, to generate a clean active material film on an inner wall of a chamber, and then absorbs and removes impurity gas such as $H_2O$, $O_2$, $H_2$, CO, $CO_2$ and the like remaining in a vacuum, by means of the active material film. As a vacuum processing equipment capable of absorbing/removing impurity gas by using an active material with no spatial constraint of a vacuum chamber caused by a getter pump, there is proposed a vacuum processing equipment that has a shield plate and provides an opposite surface of a processing part of the shield plate with an absorption film of an active material for absorbing impurity gas (Japanese Patent Application Publication No. 2001-234326). There is also proposed an equipment in which a target is configured by a film-forming material region and an annular active material surrounding the film-forming material region and a shield is used to block sputtered particles generated from an active material region (Japanese Patent Application Publication No. 2010-106290).

However, one of the major problems of the technology using a conventional getter pump is a spatial constraint in the vacuum chamber. Another problem is a worsening of the magnetic property of the magnetic recording medium due to an accumulation of the heated/evaporated active material on the medium substrate.

Moreover, in the method for preventing the active material from accumulating on the substrate by blocking the active material with the shield, the shield often needs to be replaced because particles are produced as a result of an accumulation of the active material on the shield, deteriorating the maintenance and productivity.

In addition, in the invention disclosed in Japanese Patent Application Publication No. 2010-106290 in which the target is configured by the film-forming material region and the active material surrounding the film-forming material region and the shield is used to block the sputtered particles generated from the active material region, it is difficult to create the target, and the maintenance becomes worse.

SUMMARY OF THE INVENTION

The present invention was contrived in view of the circumstances described above, and an object thereof is to provide a method for manufacturing a magnetic recording medium, which is capable of effectively removing impurity gas present in an atmosphere inside a vacuum chamber, to form a high-quality magnetic recording layer inexpensively and without deteriorating the characteristics of the magnetic recording medium.

The object of the present invention is achieved by the following method.

A method for manufacturing a magnetic recording medium is a method having a step of sequentially forming an active material layer and a magnetic recording layer immediately above the active material layer, the method having a step of using a film-forming equipment configured by coupling a plurality of chambers performing processes independently, to form the magnetic recording layer while forming the active material layer, with a gate opened between an active material layer chamber and a magnetic recording layer chamber adjacent thereto. The object of the present invention can also be achieved by a method for manufacturing a magnetic recording medium, which has a step of forming the magnetic recording layer while forming the active material layer in the same chamber.

According to these methods, the magnetic recording layer can be formed from a material that includes Co with a hexagonal close-packed (hcp) structure, and the active material layer can be formed from any of Ti, Cr, Mn and Si or a compound having at least one of these elements as a main component.

Further, the magnetic recording layer can be formed from a material having CoPt or FePt with a $L1_0$-ordered structure as a main component, and the active material layer can be formed from any of Ti, Cr, Mn and Si or a compound having at least one of these elements as a main component. The film thickness of the active material layer can be 0.1 to 10 nm.

In another embodiment, a method for manufacturing a magnetic recording medium is a method having a step of sequentially forming a magnetic recording layer and an active material layer immediately above the magnetic recording layer, wherein a film-forming equipment configured by coupling a plurality of chambers performing processes independently, is used to form the active material layer while forming the magnetic recording layer, with a gate opened between a magnetic recording layer chamber and an active material layer chamber adjacent thereto. The object of the present invention can also be achieved by a method for manufacturing a magnetic recording medium, which has a step of forming the active material layer while forming the magnetic recording layer in the same chamber.

According to these methods, the active material layer can be formed from any of Ti, Cr, Mn and Si or a compound having at least one of these elements as a main component. The film thickness of the active material layer can be 0.1 to 1 nm.

In yet another embodiment, a method for manufacturing a magnetic recording medium is a method for sequentially forming an active material layer, a magnetic recording layer immediately above the active material layer, and an active material layer immediately above the magnetic recording layer, the method having a step of using a film-forming equipment configured by coupling a plurality of chambers performing processes independently, to form the magnetic recording layer while forming the active material layers, with a gate opened between a magnetic recording layer chamber and an active material layer chamber adjacent thereto. The object of the present invention can also be achieved by a method for manufacturing a magnetic recording medium, which has a step of forming the magnetic recording layer while forming the active material layers in the same chamber.

According to these methods, the magnetic recording layer can be formed from a material that mainly contains Co with a hexagonal close-packed (hcp) structure or a material that has CoPt or FePt with a $L1_0$-ordered structure as a main component. The active material layer formed immediately below the magnetic recording layer can be formed from any of Ti, Cr, Mn and Si or a compound having at least one of these elements as a main component. The film thickness of the active material layer can be 0.1 to 10 nm. The active material layer formed immediately above the magnetic recording layer can be formed from any of Ti, Cr, Mn and Si or a compound having at least one of these elements as a main component. The film thickness of the active material layer can be 0.1 to 1 nm.

The present invention is capable of forming a high-quality magnetic recording layer at low costs and providing a magnetic recording medium having excellent electromagnetic conversion characteristics.

BRIEF DESCRIPTION OF THE DRAWINGS

FIG. 5 is a schematic side view of a chamber configuration used in the present invention;

FIG. 6 is a schematic side view showing an example of the chamber configuration used in the present invention, the example being different from the one shown in FIG. 5; and FIG. 7 is a schematic side view showing an example of the chamber configuration used in the present invention, the example being different from the ones shown in FIGS. 5 and 6.

DESCRIPTION OF THE PREFERRED EMBODIMENTS

The present invention is described hereinafter in detail with reference to the diagrams.

Figure 1:
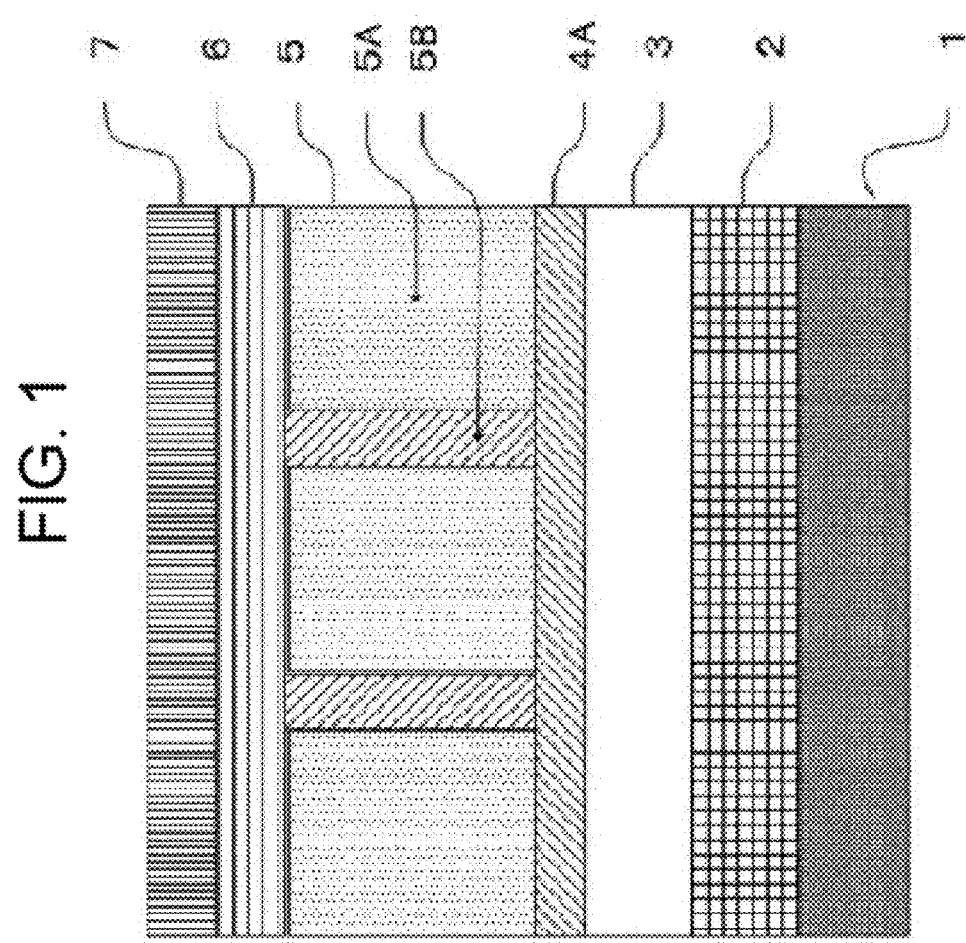
FIG. 1 is a schematic cross-sectional diagram showing an example of a perpendicular magnetic recording medium according to the present invention.
Figure 2:
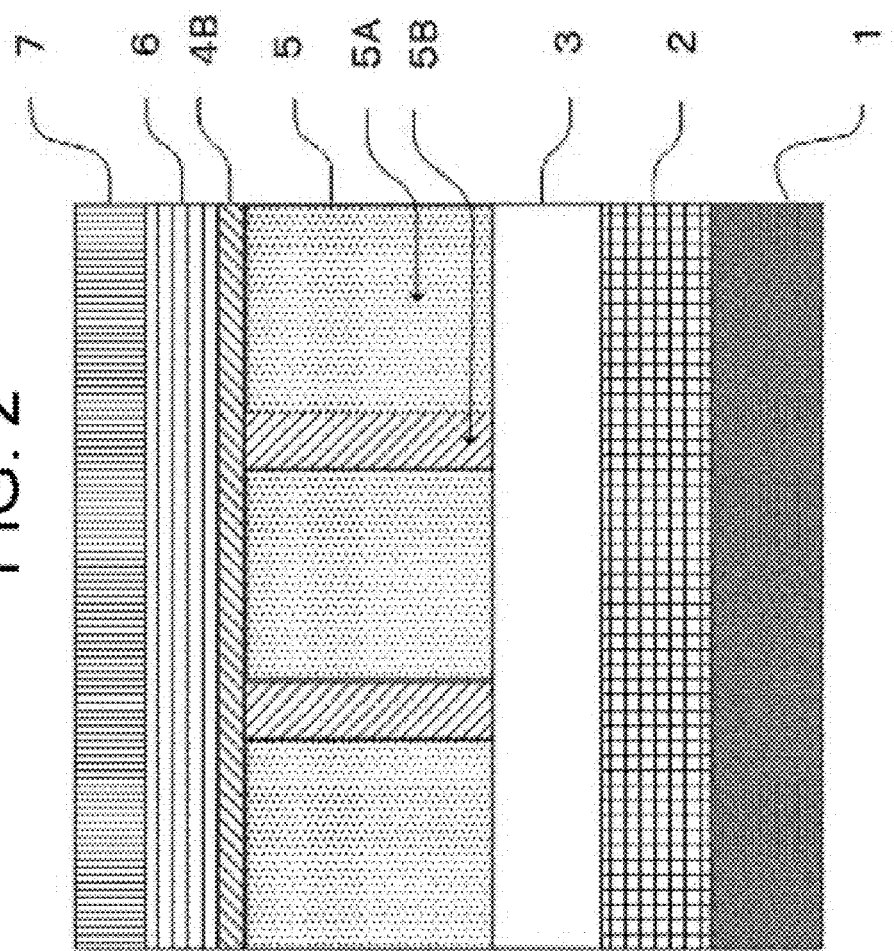
FIG. 2 is a schematic cross-sectional diagram of another example of the perpendicular magnetic recording medium according to the present invention, the example being different from the one shown in FIG. 1.

FIGS. 1 and 2 are schematic cross-sectional diagrams, each showing an embodiment of a magnetic recording medium manufactured by the manufacturing method according to the present invention. This magnetic recording medium has a nonmagnetic substrate 1, as well as a soft magnetic under layer 2, underlayer 3, active material layer 4A or 4B, magnetic recording layer 5, protective layer 6, and liquid lubricant layer 7, which are provided sequentially on the nonmagnetic substrate 1.

Various substrates with smooth surfaces can be used as the nonmagnetic substrate 1. For example, Al alloy plated with NiP, tempered glass, crystallized glass, and the like that are normally used in magnetic recording media can be used as the nonmagnetic substrate 1.

Next is described a brief summary of a film-forming equipment for forming the soft magnetic under layer 2, underlayer 3, active material layer 4A or 4B, magnetic recording layer 5, protective layer 6 and the like. A film-forming equipment using a sputtering method is described herein; however, the method for film formation is not limited thereto.

Figure 3:
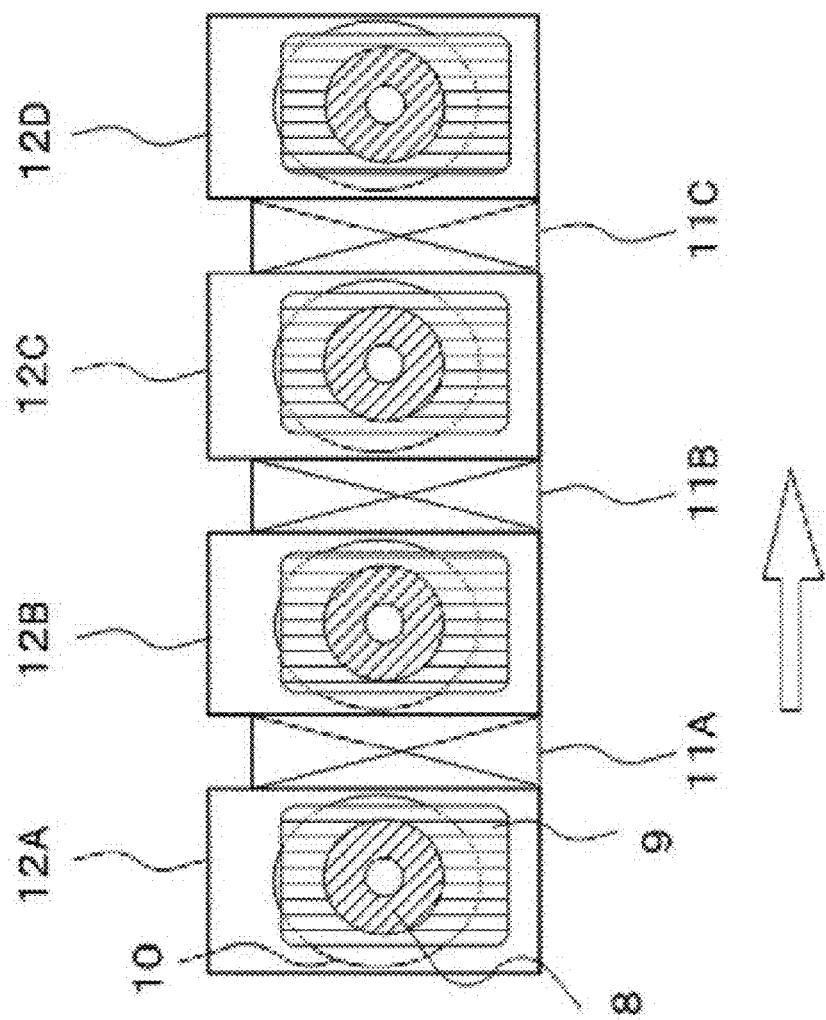
FIG. 3 is a schematic side view showing an example of a configuration of chambers constituting part of a film-forming equipment used in the present invention.
Figure 4:
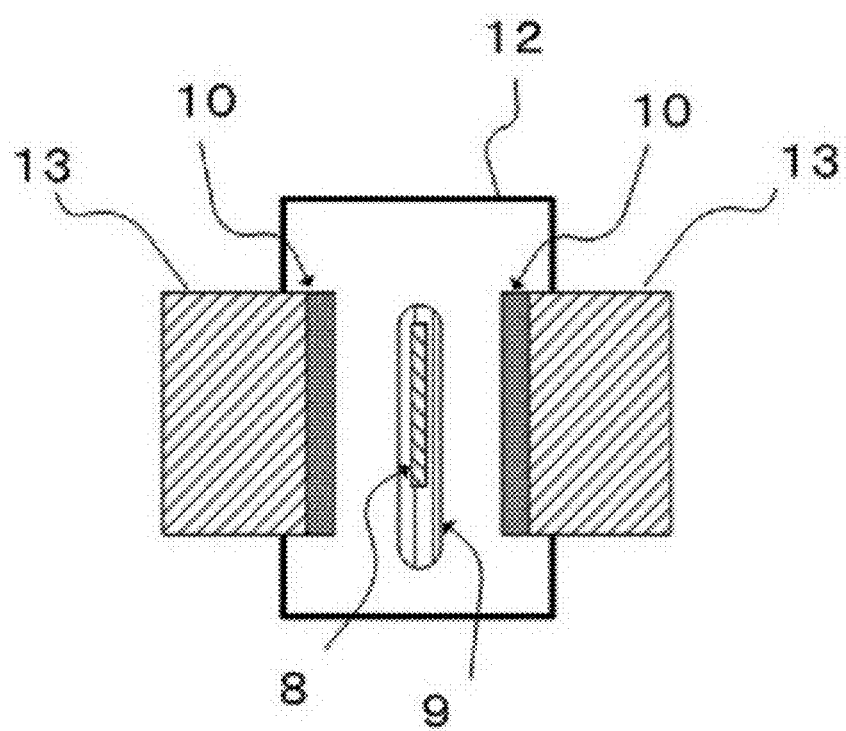
FIG. 4 is a schematic longitudinal sectional diagram of each chamber shown in FIG. 3.

FIG. 3 is a schematic side view showing an example of a part of a chamber configuration in a sputtering equipment, which is the film-forming equipment used in the present invention. FIG. 4 is a schematic longitudinal sectional diagram of the example shown in FIG. 3. Each chamber can be processed independently. In other words, as long as each chamber functions to perform film-forming, heating, and cooling processes required in magnetic recording media, it is not limited to the ones shown in FIG. 3 and FIG. 4. In addition, the relative position of a chamber and a substrate and the like are not limited to the ones described herein.

FIG. 3 shows four film-forming chambers 12. However, in the entire film-forming equipment used in the present invention, loader/unloader chambers capable of taking a workpiece in/out, a heating chamber for heating the substrate if necessary, and film-forming chambers, are connected to each other, the number of film-forming chambers corresponding to the number of layers to be stacked.

In each of the chambers, targets 10 are disposed to face each other, as shown in FIG. 4. A film formation substrate is subjected to film formation and other processes at the chambers, starting from an upstream chamber to a downstream chamber. The underlayer and other layers are formed and processed sequentially by being sent to the chambers sequentially. As shown in FIG. 4, the film-forming chambers 12 are disposed such that the targets 10 are disposed vertically on the electrode surface side of circular cathodes 13 respectively and face each other.

A film formation substrate 8 is supported on a substrate carrier 9. The center of each target 10 and the film formation substrate 8 are positioned coaxially. The film formation substrate 8 is conveyed while being supported by the substrate carrier 9 in a space between the two targets 10 that are vertically disposed facing each other. The substrate carrier 9 is conveyed in a horizontal direction in space of FIG. 3. The chambers are connected by gates 11A, 11B, and 11C. With the gates opened, the substrate carrier 9 supporting the film formation substrate 8 can be moved between the chambers.

Although not shown, each of the film-forming chambers has gas supply means and exhaust means. The gas supply means is for supplying sputtering gas into each film-forming chamber. The exhaust means is a vacuum pump. The aperture of a valve of the vacuum pump and operations of the vacuum pump are used for reducing the pressure inside each chamber and keeping the degree of vacuum used for forming films by means of reactive sputtering. As shown in FIG. 3, between the chambers are the gates that are normally opened only when the substrate is conveyed. While the gates 11A, 11B, and 11C between the chambers are closed, the chambers are sealed, and therefore the gaseous species or the degree of vacuum of each chamber can be changed. Each of the vacuum pumps to be connected is preferably a cryopump or a turbo-molecular pump in order to obtain a high degree of cleanliness and high degree of vacuum. Note that the chambers for forming active material layers are referred to as "active material layer chambers" and the chambers for forming magnetic recording layers are referred to as "magnetic recording layer chambers."

FIG. 3 shows a chamber configuration in which one chamber is provided with one film formation substrate and one set of cathodes (both sides). However, another chamber configuration is possible in which a plurality of film formation substrates are processed in a single chamber.

Moreover, a film-forming equipment that has a chamber configured to form a plurality of different layers (multi-layer chamber) can be used. FIG. 7 shows an example of a multi-layer chamber with a reference numeral 19B. In this single chamber 19B, a plurality of targets corresponding to predetermined layers are disposed in film-forming positions 20A, 20B of the predetermined layers. Preferably, in this chamber, a shield 21 is provided between the targets so that sputtering particles of the adjacent targets are not formed on the adjacent medium substrate. While a certain layer is formed in the film-forming position 20A, another layer can be formed in the adjacent film-forming position 20B. Therefore, the productivity such as throughput is not deteriorated. As shown in FIG. 7, the multi-layer chamber can be used in some of the chambers constituting the sputtering equipment in which the chambers performing processes independently are coupled to each other as shown in FIGS. 3 and 4.

Next, after the substrate is cleaned and dried, the soft magnetic under layer 2, underlayer 3, active material layer 4A or 4B, magnetic recording layer 5, protective layer 6, and the like are formed using the film-forming equipment.

It is preferred that the soft magnetic under layer 2 improve read/write characteristics by controlling a magnetic flux generated from a magnetic head. Alternatively, this layer can be omitted. For example, crystalline NiFe alloy, Sendust (FeSiAl) alloy, CoFe alloy, microcrystalline FeTaC, CoFeNi, CoNiP, or the like, can be used as the soft magnetic backing layer 2. The optimum thickness of the soft magnetic backing layer 2 changes depending on the structure and characteristics of the magnetic head used for magnetic recording. However, when forming the soft magnetic under layer 2 and other layers continuously, it is preferred that the thickness of the soft magnetic backing layer 2 be at least 10 nm but no more than 500 nm in consideration of the productivity.

The underlayer 3 is used for the purpose of reducing surface roughness of the magnetic recording layer 5, ensuring adherence of the magnetic recording layer 5, and controlling the crystal grain diameter and crystalline orientation in the magnetic recording layer 5. Hence, the crystalline structure of the underlayer 3 needs to be selected according to the material of the magnetic recording layer thereabove, but a structure in which an amorphous material is used in the underlayer 3 can also be used. For instance, when a material that mainly contains Co with a hexagonal close-packed (hcp) structure is used in the magnetic recording layer 5 immediately above the underlayer 3, it is preferred that a material having the same hcp structure or a face-centered-cubic (fcc) structure be used in the underlayer 3 as well. Specifically, an element such as Ru, Re, Rh, Pt, Pd, Ir, Ni or Co or a material containing these elements is preferably used in the underlayer 3, but the material that can be used in the underlayer 3 is not limited thereto. When a material that has CoPt or FePt with a $L1_0$-ordered structure as a main component is used in the magnetic recording layer 5, a material containing Mg, Ta or Cr can be used as the underlayer 3, and MgO is preferred. Furthermore, a plurality of the underlayers 3 can be stacked. The thickness of the underlayer 3 is selected in consideration of improvement of the crystallinity of the magnetic recording layer 5, durability of the same, electromagnetic conversion characteristics of a recording signal, and productivity, and is preferably 5 to 100 nm. A heat chamber may be provided to heat the film formation substrate after the underlayer is formed.

Subsequently, the active material layer and the magnetic recording layer are formed. We had discovered that, when forming an active material layer at least immediately below or immediately above a magnetic recording layer, a manufacturing method that has a step of forming the magnetic recording layer while forming the active material layer, by using a film-forming equipment configured by coupling the plurality of chambers performing processes independently, with the gates opened between the magnetic recording layer forming chamber and the active material layer forming chamber adjacent thereto, and a manufacturing method that has a step of forming the magnetic recording layer while forming the active material layer in the same chamber (the multi-layer chamber described above), can reduce crystalline orientation dispersion ($\Delta\theta_{50}$) of a magnetic material of the magnetic recording layer and improve the electromagnetic conversion characteristics. The step of forming the magnetic recording layer while forming the active material layer may include a state in which there exists a coincident period of formation of the active material layer while the formation of magnetic recording layer, or a state in which the both layers are formed simultaneously. The time period during which the magnetic recording layer is formed may be longer or shorter than the time period during which the active material layer is formed. Furthermore, the formation of the magnetic recording layer may be started prior to or after the formation of the active material layer. The formation of the magnetic recording layer may be ended prior to or after the formation of the active material layer. The crystalline orientation dispersion is the characteristics for measuring the crystalline orientation in the magnetic recording layer and is normally obtained by X-ray diffraction. The smaller the crystalline orientation dispersion, the better the crystalline orientation. An improvement of the crystalline orientation of the magnetic recording layer when forming the active material layer immediately above or immediately below the magnetic recording layer is considered to be an effect caused by a decrease in impurity gas concentration upon formation of the magnetic recording layer. Even when the active material layer is used immediately below the magnetic recording layer, i.e., between the underlayer and the magnetic recording layer, the magnetic recording layer with comprehensively good crystallinity can be formed by controlling the material and film thickness of the active material layer and without deteriorating the function of the underlayer. Moreover, when providing the active material layer immediately above the magnetic recording layer, the effect of improving the crystallinity of the magnetic recording layer can compensate for a decrease in signal intensity caused by an increase in the distance between the magnetic recording layer and the head by controlling the material and film thickness of the active material layer, realizing excellent electromagnetic conversion characteristics.

Next is described, as Embodiment 1, a method for sequentially forming the active material layer 4A and the magnetic recording layer 5 of the perpendicular magnetic recording medium of FIG. 1 by using a film-forming equipment shown in FIG. 5.

A target for forming the underlayer is disposed on each of cathodes that are disposed in a chamber 15A so as to face each other. A target for forming the active material layer 4A is disposed in a chamber 15B. A target for forming the magnetic recording layer 5 is disposed in the next adjacent chamber 15C. A chamber 15D is provided with a protective layer forming unit or a heating unit for pre-treating the protective layer. Note that FIG. 5 shows a state in which a film-forming process is ended once and the subsequent film formation is about to take place.

From the state shown in FIG. 5, the film formation substrate of the chamber 15A, on which the underlayer is formed with gates 14A and 14C opened, is mounted on the substrate carrier and sent to the chamber 15B in which the target for forming the active material layer is disposed. The active material layer of the chamber 15B is formed on the film formation substrate, which is sent to the chamber 15C. Next, the gate 14A between the underlayer chamber 15A and the active material layer chamber 15B is closed. With the gate 14B opened between the active material layer chamber 15B and the magnetic recording layer chamber 15C, and with the adjacent gate 14C and the like closed, the sputtering gas is introduced from the gas supply means into the chambers. Subsequently, each of the cathodes is supplied with electric power and caused to discharge. As a result, the sputtered particles are extracted from the targets and deposited on the film formation substrate. When a predetermined thickness is obtained in the film formation substrate, the film-forming process is ended.

Next is described, as Embodiment 2, a method for sequentially forming the magnetic recording layer 5 and the active material layer 4B shown in FIG. 2 by using a film-forming equipment shown in FIG. 6.

A target for forming the underlayer is disposed on each of cathodes that are disposed in a chamber 17A so as to face each other. A target for forming the magnetic recording layer 5 is disposed in a chamber 17B. A target for forming the active material layer 4B is disposed in the next adjacent chamber 17C. A chamber 17D is provided with a protective layer forming unit or a heating unit for pre-treating the protective layer. Note that FIG. 6 shows a state in which a film-forming process is ended once and the subsequent film formation is about to take place.

From the state shown in FIG. 6, the film formation substrate of the chamber 17A, on which the underlayer is formed with gates 16A and 16C opened, is mounted on the substrate carrier and sent to the chamber 17B in which the target for forming the magnetic recording layer is disposed. The magnetic recording layer of the chamber 17B is formed on the film formation substrate, which is sent to the chamber 17C. Next, the gate 16A between the underlayer chamber 17A and the magnetic recording layer chamber 17B is closed. With the gate 16B opened between the magnetic recording layer chamber 17B and the active material layer chamber 17C, and with the adjacent gate 16C and the like closed, the sputtering gas is introduced from the gas supply means into the chambers. Subsequently, each of the cathodes is supplied with electric power and caused to discharge. As a result, the sputtered particles are extracted from the targets and deposited on the film formation substrate. When a predetermined film thickness is obtained in the film formation substrate, the film-forming process is ended.

The manufacturing method having a step of forming the magnetic recording layer while forming the active material layer in the same chamber (19B) may form the active material layer at least immediately below or immediately above the magnetic recording layer, as shown in FIG. 7.

In the present invention, the active material layer is formed with the gate opened between the magnetic recording layer chamber and the chamber adjacent thereto (active material layer chamber). In so doing, the impurity gas and active material present in the atmosphere of each chamber are joined to each other by sputtering of the active material, whereby the impurity gas within the active material layer chamber is removed effectively. The amount of impurity gas gradually decreases in the magnetic recording layer chamber adjacent to the active material layer chamber as well, through the gate between the chambers. Therefore, a high-quality magnetic recording layer can be obtained. Moreover, selecting a material and thickness for a thin film configured by the active material layer, can improve the quality of the magnetic recording signal more effectively.

The magnetic recording layer and active material layer are described next.

FIG. 1 shows an example of the active material layer 4A configured immediately below the magnetic recording layer 5. As shown in FIG. 1, when configuring the active material layer 4A immediately below the magnetic recording layer 5, the active material layer needs to have a so-called getter effect for lowering the impurity gas concentration, control the crystal grain diameter and crystalline orientation of the magnetic recording layer 5, and not preclude a function for controlling the crystal grain diameter and crystalline orientation in the underlayer. Furthermore, in order to meet the reliability of the magnetic recording medium, the active material layer needs to be formed from a material having excellent adherence with the magnetic recording layer and corrosion resistance and producing low surface roughness after the formation of the active material layer. As a result of a keen investigation of these requirements, it was found that, when a material containing Co with a hexagonal close-packed (hcp) structure is used as the magnetic recording layer 5, the material of the active material layer 4A to be formed under the magnetic recording layer 5 is preferably any of Ti, Cr, Mn and Sn or a compound containing at least one of these elements as a main component. When using the compound, the getter effect for lowering the impurity gas concentration in each film-forming chamber can be obtained as long as the element used as the main component has 20 atomic percent (at %) or more. By having low ionization energy and being chemically active, Ti, Cr, Mn, Si and a compound thereof are effective in absorbing impurity gas consisting of hydrogen, oxygen, nitrogen, carbon monoxide, or other active gas. Such elements as Si, Mn, and Cr metals are particularly preferred.

When a material that has a CoPt or FePt with a $L1_0$-ordered structure as a main component is used for the magnetic recording layer 5, it is preferred to use any of Ti, Cr, Mn and Si or a material that has at least one of these elements as a main component. Materials such as TiN, $SrTiO_3$, $BaTiO_3$ and the like are more preferred. When using the compound, the getter effect for lowering the impurity gas concentration in each film-forming chamber is realized as long as the element used as the main component has 20 atomic composition percent (at %). By having low ionization energy and being chemically active, Ti, Cr, Mn, Si and a compound thereof are effective in absorbing impurity gas consisting of hydrogen, oxygen, nitrogen, carbon monoxide, or other active gas. Especially TiN, $SrTiO_3$, $BaTiO_3$ and the like have a body centered cubic (bcc) structure and are compatible with the materials with a $L1_0$-ordered structure that are stacked thereabove. Therefore, these elements are effective in improving the crystalline orientation of the $L1_0$-ordered structure.

The thickness of the active material layer 4A is selected in consideration of improvement of the crystallinity of the magnetic recording layer 5, durability of the same, electromagnetic conversion characteristics of a recording signal, and productivity. The thinner the active material layer 4A, the easier it is to write, but the effect of the crystalline orientation of the recording layer that results from reducing the impurity gas concentration is low. The thickness of the active material layer 4A is preferably 0.1 to 10 nm, and more preferably 0.1 to 1 nm.

FIG. 2 shows an example of the active material layer 4B configured immediately above the magnetic recording layer 5. When forming a C (carbon) layer on the active material layer 4B as a protective layer, the material of the active material layer 4B is preferably any of Ti, Cr, Mn and Sn or a compound having at least one of these elements as a main component. More preferably, the material of the active material layer 4B is Si, Mn, or Cr metal. When using the compound, the getter effect for lowering the impurity gas concentration in each film-forming chamber can be realized as long as the element used as the main component has 20 atomic composition percent (at %) or more. By having low ionization energy and being chemically active, Ti, Cr, Mn, Si and a compound thereof are effective in absorbing impurity gas consisting of hydrogen, oxygen, nitrogen, carbon monoxide, or other active gas. In view of reliability of the magnetic recording medium, these elements were eventually applied as a result of a keen investigation because these elements are excellent in adherence with the protective layer, corrosion resistance etc., and produce low surface roughness after the formation of the active material layer 4B.

The thickness of the active material layer 4B is selected in consideration of improvement of the crystallinity of the magnetic recording layer 5, durability of the same, electromagnetic conversion characteristics of a recording signal, and productivity. The thinner the active material layer 4B, the shorter the distance between the magnetic head and the magnetic recording layer, improving the signal intensity. However, when the active material layer 4B is too thin, the crystallinity of the magnetic recording layer cannot improve. Therefore, it is preferred that the thickness of the active material layer 4B be 0.1 to 1 nm. In this case, the magnetic recording layer 5 can be formed from a material that mainly contains Co with a hexagonal close-packed (hcp) structure or a material having CoPt or FePt with a $L1_0$-ordered structure as a main component.

Active material layers may be configured immediately below and above the magnetic recording layer. In this case, the active material layers (material, film thickness) can be selected in accordance with the magnetic recording layer in the same manner as in the case where the active material layer is configured immediately below the magnetic recording layer and in the case where the active material layer is configured immediately above the magnetic recording layer.

The magnetic recording layer 5 may be configured by a layer formed from a ferromagnetic material and having a so-called granular structure. In the granular structure, magnetic parts 5A, each of which has magnetic grain mainly containing a magnetic element and has a columnar structure, are partitioned and surrounded by nonmagnetic parts 5B in a substrate in-plane structure. The distance between the partitioned magnetic parts 5A is preferably short in order to cope with an increase in recording density. In view of thermal fluctuation and reading signals, it is preferred that the grain diameter of the magnetic parts 5A is large. Therefore, it is desired that the width of each nonmagnetic part 5b be as narrow as possible so as to reduce magnetic coupling between the magnetic parts 5A. It is preferred that the grain diameter of each magnetic part 5A be approximately 3 to 10 nm, and that the width of each nonmagnetic part 5B be approximately 0.1 to 4 nm, in terms of obtaining a magnetic recording medium having high recording density and favorable signal characteristics.

For the magnetic parts 5A of the magnetic recording layer, magnetic grain obtained by adding metals such as Cr, B, Ta or W to CoPt alloy are preferably used. The magnetic recording layer 5 can be formed by means of a sputtering method (DC magnetron sputtering method) using a target made of a mixture of the material constituting the magnetic parts 5A and the material constituting the nonmagnetic parts 5B. In addition, a magnetic material with high magnetocrystalline anisotropy (Ku), such as CoPt or FePt with a $L1_0$-ordered structure, or alloy obtained by adding Ni or Cu to this magnetic material, can be used as the magnetic parts 5A. It is desired that the width of each nonmagnetic part 5B be as narrow as possible in a range of assuring a small magnetic coupling between the magnetic parts 5A. A material that magnetically separates the magnetic parts 5A and forms less solid solution in the magnetic parts 5A, is favorably used as the nonmagnetic parts 5B. For example, an oxide, a carbon-based material, or a mixture of an oxide and carbon-based material, can be used as the nonmagnetic parts 5B. Examples of the oxide include $SiO_2$, $TiO_2$, and MgO. Examples of the carbon-based material include carbon (C), $B_4C$, BC, SiC, and various other carbides.

A plurality of the magnetic recording layers may be stacked to obtain a stacked body. In this case, an exchange-coupling control layer may be inserted between the magnetic recording layers to obtain an ECC structure. For instance, when forming a magnetic recording layer A, an exchange-coupling control layer, and a magnetic recording layer B sequentially, a magnetic part of the magnetic recording layer B is positioned immediately above a magnetic part of the magnetic recording layer A via the exchange-coupling control layer. Because a nonmagnetic part is positioned around a magnetic part, each section between a lower magnetic part and an upper magnetic part grows in the shape of a cylinder from the magnetic recording layer A up to the magnetic recording layer B through the exchange-coupling control layer. In such a structure, the sections between the lower magnetic part and the upper magnetic part is magnetically coupled to each other and partitioned by the nonmagnetic parts, to configure magnetization reversal units independent from each other, realizing favorable signal characteristics. In view of write/read characteristics of a recording signal of the magnetic recording layer, it is preferred that the thickness of the stacked body be approximately at least 5 nm but no more than 50 nm.

The protective layer is formed next. The protective layer 6 can be a conventional hard protective layer, such as a hard protective layer that mainly contains carbon. The protective layer 6 can be a single layer, a carbon stacked layer of different properties, a stacked body with a metal layer and carbon layer, or a carbon stacked body with an oxide layer. Further, even when the active material layer 4B is configured immediately above the magnetic recording layer as shown in FIG. 2, the protective layer 6 formed thereabove can be a conventional hard protective layer. The protective layer 6 can be formed by means of sputtering, chemical vapor deposition (CVD), or evaporation. A combination of these methods may be used to form the protective layer 6. After the formation of the magnetic recording layer, the film formation substrate may be subjected to a cooling or heating process as a process performed prior to the formation of the protective layer 6.

Next, the film formation substrate is removed from the film-forming equipment to form the liquid lubricant layer 7 on the protective layer 6. For example, a perfluoropolyether lubricant can be used as the liquid lubricant layer 7. Additionally, various lubricant materials that are generally used as the materials for liquid lubricant layers of magnetic recording media can be used in the liquid lubricant layer 7. The liquid lubricant layer 7 can be formed by a dip method, a spin coat method, and the like.

EXAMPLES

Examples of the present invention are described hereinafter in detail. The present invention is not limited to the following examples as long as the scope of the present invention is persisted.

Example 1

This example relates to a method for manufacturing a perpendicular magnetic recording medium having a nonmagnetic substrate and a CoZrNb soft magnetic under layer, Ta underlayer, Cr underlayer, active material layer (TiN), magnetic recording layer (FePt—C granular layer), carbon protective layer, and liquid lubricant layer that are provided sequentially on the nonmagnetic substrate.

The layers from the CoZrNb soft magnetic under layer to the carbon protective layer were formed using a 200 Lean, an inline sputtering equipment manufactured by Intevac, Inc. The chambers for forming these layers are coupled to each other by the gates. The chambers include a film-forming chamber for forming layers on a film formation substrate, a loader/unloader chambers for taking a workpiece in/out, a heating chamber incorporated with a heater for heating the substrate, and a cooling chamber for cooling the substrate. Sets of a cathode and target that face each other are provided in a single film-forming chamber. In this example, a loader chamber, CoZrNb soft magnetic under layer chamber, Ta underlayer chamber, Cr underlayer chamber, heating chamber (corresponding to 15A shown in FIG. 5), active material layer (TiN) chamber (corresponding to 15B shown in FIG. 5), magnetic recording layer (FePt—C granular layer) chamber (corresponding to 15C shown in FIG. 5), cooling chamber (corresponding to 15D shown in FIG. 5), carbon protective chamber, and unloader chamber, are configured in this order.

A N-10 glass substrate (manufactured by HOYA Corporation) of 48 mm outer diameter, 12 mm inner diameter, and 0.64 mm plate thickness having a smooth layer was used as the nonmagnetic substrate. This substrate was cleaned, dried, and then introduced into the film-forming equipment. The film formation substrate that was introduced from the loader chamber into the film-forming equipment was sent to the CoZrNb soft magnetic under layer chamber. While this chamber was sealed by closing the adjacent gate and supplied with Ar gas under low pressure, a CoZrNb amorphous soft magnetic under layer of 50 nm thickness was formed using a CoZrNb target.

Next, the film formation substrate was moved to the adjacent chamber. While the chamber was sealed by closing the gate and supplied with Ar gas under low pressure, a Ta film of 2 nm thickness was formed using a Ta target. In the next chamber, a Cr film of 10 nm thickness was formed using a Cr target.

In the subsequent chamber, the film formation substrate was heated to 400° C. by the heater.

In the next active material layer chamber, the active material layer was formed. While Ar gas was introduced under low pressure, the active material layer was formed by using a TiN target. Five types of active material layers having a film thickness of 0.1 nm, 1 nm, 5 nm, 10 nm, and 15 nm were formed. Note that the gate between the heating chamber and the active material layer chamber (the gate corresponding to 14A shown in FIG. 5) was closed, and the gate between the active material layer chamber and the magnetic recording layer chamber (the gate corresponding to 14B shown in FIG. 5) was opened. Further, the gate between the magnetic recording layer chamber and the cooling chamber (the gate corresponding to 14C shown in FIG. 5) was closed, and the active material layer chamber and the magnetic recording layer chamber were sealed from the other chambers. Note that during the formation of the active material layer, in the adjacent magnetic recording layer chamber the magnetic recording layer is formed on the substrate on which the active material layer is already formed.

In the subsequent magnetic recording layer chamber, the magnetic recording layer (FePt—C granular layer) was formed, and, while introducing Ar gas under low pressure, a magnetic recording layer (Fe50Pt50-C) of 10 nm thickness was formed using a 75 vol % (Fe50Pt50)-25 vol % C target.

In the next cooling chamber, the film formation substrate was cooled to 150° C. by bringing a cooling plate close to the film formation substrate.

Finally, in the carbon protective layer chamber, a carbon protective film of 3 nm thickness was formed using a carbon target, and the resultant film formation substrate was removed from the unloader chamber.

Thereafter, a perfluoropolyether liquid lubricant layer of 2 nm thickness was formed using a dip method, to obtain a perpendicular magnetic recording medium.

Comparative Example 1

A perpendicular magnetic recording medium was prepared using the same method, except that the film thickness of the active material layer was set at 0 nm (i.e., the active material layer was not formed) in Example 1.

Comparative Example 2

A perpendicular magnetic recording medium was prepared using the same method as Example 1, except that the gate between the active material layer chamber and the magnetic recording layer chamber was closed, that film formation was performed with the both chambers sealed, and that the active material layer of 3 nm thickness was formed n Example 1.

Example 2

This example relates to a method for manufacturing a perpendicular magnetic recording medium having a nonmagnetic substrate and a CoZrNb soft magnetic under layer, NiCrMo underlayer, Ru underlayer, magnetic recording layer (CoCrPt-TSiO$_2$ granular layer), active material layer (Ti), carbon protective layer, and liquid lubricant layer that are provided sequentially on the nonmagnetic substrate.

Using the same equipment as that used in Example 1, the chambers and targets were replaced.

In this example, a loader chamber, CoZrNb soft magnetic under layer chamber, NiCrMo underlayer chamber, Ru underlayer chamber, first heating chamber (corresponding to 17A shown in FIG. 6), magnetic recording layer (CoZrPt—TiO$_2$ granular layer) chamber (corresponding to 17B shown in FIG. 6), active material layer (Ti) chamber (corresponding to 17C shown in FIG. 6), second heating chamber (corresponding to 17D shown in FIG. 6), carbon protective chamber, and unloader chamber, are configured in this order.

First, a N-10 glass substrate (manufactured by HOYA Corporation) with a smooth surface was used as the nonmagnetic substrate. This substrate was cleaned, dried, and then introduced into the film-forming equipment. The film formation substrate that was introduced from the loader chamber into the film-forming equipment was sent to the CoZrNb soft magnetic under layer chamber. While this chamber was sealed by closing the adjacent gate and supplied with Ar gas under low pressure, a CoZrNb amorphous soft magnetic under layer of 50 nm thickness was formed using a CoZrNb target.

Next, the film formation substrate was moved to the adjacent chamber. While the chamber was sealed by closing the gate and supplied with Ar gas under low pressure, a NiCrMo film of 5 nm thickness was formed using a NiCrMo target. In the next chamber, a Ru film of 20 nm thickness was formed using a Ru target.

In the next first heating chamber, the film formation substrate was heated to 200° C. by the heater.

In the subsequent magnetic recording layer chamber, a magnetic recording layer (CoCrPt—TiO$_2$) of 10 nm thickness was formed using a 90 vol % (Co70Cr10Pt20)-10 vol % (TiO$_2$) target. Note that the gate between the first heating chamber and the magnetic recording layer chamber (the gate corresponding to 16A shown in FIG. 6) and the gate between the active material layer chamber and the second heating chamber (corresponding to 17D shown in FIG. 6) (the gate corresponding to 16C shown in FIG. 6) were closed, and the gate between the magnetic recording layer chamber and the active material layer chamber (the gate corresponding to 16B shown in FIG. 6) was opened. Consequently, the magnetic recording layer chamber and the active material layer chamber were sealed from the other chambers. Note that during the formation of the magnetic recording layer, in the adjacent active material layer chamber the active material layer is formed on the substrate on which the magnetic recording layer is already formed.

The active material layer was formed in the subsequent active material layer chamber. While Ar gas was introduced under low pressure, the active material layer was formed using a Ti target. Five types of active material layers having a film thickness of 0.1 nm, 0.5 nm, 1 nm, 2 nm, and 5 nm were formed.

In the subsequent second heating chamber, the film formation substrate was heated to 150° C. by the heater.

Finally, in the carbon protective layer chamber, a carbon protective film of 3 nm thickness was formed using a carbon target, and the resultant film formation substrate was removed from the unloader chamber.

Thereafter, a perfluoropolyether liquid lubricant layer of 2 nm thickness was formed using a dip method, to obtain a perpendicular magnetic recording medium.

Comparative Example 3

A perpendicular magnetic recording medium was prepared using the same method, except that the film thickness of the active material layer was set at 0 nm (i.e., the active material layer was not formed) in Example 2.

Comparative Example 4

A perpendicular magnetic recording medium was prepared using the same method as Example 2, except that the gate between the magnetic recording layer chamber and the active material layer chamber was closed, that film formation was performed with the both chambers sealed, and that the active material layer of 0.3 nm thickness was formed n Example 2.

Evaluation results on Examples 1 and 2 and Comparative Examples 1 and 2 are described hereinafter. The amount of oxygen atoms contained in the magnetic recording layer of each magnetic recording medium was measured using an ESCA (electron spectroscopy for chemical analysis).

Table 1 below shows the evaluation results on Example 1 and Comparative Examples 1 and 2.

TABLE 1

|  | Film thickness of active material layer | Amount of oxygen atoms in magnetic recording layer (strength ratio obtained when active material layer thickness of Example 1-3 is 5 nm) |
|---|---|---|
| Example 1-1 | 0.1 nm | 150 |
| Example 1-2 | 1 nm | 120 |
| Example 1-3 | 5 nm | 100 |
| Example 1-4 | 10 nm | 90 |
| Example 1-5 | 15 nm | 85 |
| Comparative Example 1 | 0 (not formed) | 500 |
| Comparative Example 2 | 3 nm | 480 |

As shown in Table 1, the amount of oxygen atoms contained in each magnetic recording layer was reduced significantly by forming the active material layer, with the gate opened between the active material layer chamber and the magnetic recording layer chamber. The amount of oxygen atoms contained in the magnetic recording layer of Example 1 was reduced more significantly than those of Comparative Examples 1 and 2. It is considered because the film formation method of the present invention is capable of reducing the impurity concentrations in the film-forming chambers. In addition, this effect becomes prominent when the active material layer is formed to have a thickness of 0.1 nm. It was found that the amount of oxygen atoms contained in the magnetic layer can be reduced by using the film formation method of the present invention. Furthermore, the crystalline orientation dispersion ($\Delta\theta_{50}$) of the magnetic layer of each magnetic recording medium was measured using an X-ray diffractometer.

The results on Example 1 and Comparative Examples 1 and 2 are shown in Table 2, and the results on Example 2 and Comparative Examples 3 and 4 are shown in Table 3.

TABLE 2

|  | Film thickness of active material layer | Crystal orientation dispersion ($\Delta\theta_{50}$) |
|---|---|---|
| Example 1-1 | 0.1 nm | 2.9° |
| Example 1-2 | 1 nm | 2.9° |
| Example 1-3 | 5 nm | 2.6° |
| Example 1-4 | 10 nm | 2.8° |
| Example 1-5 | 15 nm | 3.8° |
| Comparative Example 1 | 0 (not formed) | 4.4° |
| Comparative Example 2 | 3 nm | 4.2° |

TABLE 3

|  | Film thickness of active material layer | Crystal orientation dispersion ($\Delta\theta_{50}$) |
|---|---|---|
| Example 2-1 | 0.1 nm | 2.8° |
| Example 2-2 | 0.5 nm | 2.2° |
| Example 2-3 | 1 nm | 2.6° |
| Example 2-4 | 2 nm | 2.1° |
| Example 2-5 | 5 nm | 2.1° |
| Comparative Example 3 | 0 (not formed) | 3.4° |
| Comparative Example 4 | 0.3 nm | 4.1° |

As shown in Tables 2 and 3, the crystalline orientation dispersion of each magnetic recording layer was reduced by forming the active material layer immediately below or immediately above the magnetic recording layer and forming the active material layer, with the gate opened between the active material layer chamber and the magnetic recording layer chamber. Also, this effect becomes prominent when the active material layer is formed to have a thickness of 0.1 nm.

It was found that the crystalline orientation dispersion of each magnetic recording layer can be reduced by using the film formation method of the present invention, and that the magnetic recording layer with excellent crystalline quality can be formed. It is considered because the film formation method of the present invention is capable of reducing impurity defects in each magnetic recording layer.

Next, the electromagnetic conversion characteristics were measured using a commercially available spinstand. Each magnetic recording medium was rotated at 5400 rpm and signals in a middle circumferential section of the substrate were recorded, to measure signal noise ratio (SNR) characteristics, the primary electromagnetic characteristics. In so doing, the write width was set at 78 nm. The results on Example 1 and Comparative Examples 1 and 2 are shown in Table 4, and the results on Example 2 and Comparative Examples 3 and 4 are shown in Table 5.

TABLE 4

|  | Film thickness of active material layer | SNR |
|---|---|---|
| Example 1-1 | 0.1 nm | 10.1 dB |
| Example 1-2 | 1 nm | 10.2 dB |
| Example 1-3 | 5 nm | 10.3 dB |
| Example 1-4 | 10 nm | 10.2 dB |
| Example 1-5 | 15 nm | 9.5 dB |
| Comparative Example 1 | 0 (not formed) | 9.5 dB |
| Comparative Example 2 | 3 nm | 9.1 dB |

TABLE 5

|  | Film thickness of active material layer | SNR |
|---|---|---|
| Example 2-1 | 0.1 nm | 10.3 dB |
| Example 2-2 | 0.5 nm | 10.5 dB |
| Example 2-3 | 1 nm | 10.5 dB |
| Example 2-4 | 2 nm | 9.7 dB |
| Example 2-5 | 5 nm | 9.4 dB |
| Comparative Example 3 | 0 (not formed) | 9.8 dB |
| Comparative Example 4 | 0.3 nm | 9.3 dB |

As shown in Table 4, in Example 1 the SNR characteristics of the active material layers having film thicknesses of 0.1 to 10 nm are improved. As shown in Table 5, in Example 2 the SNR characteristics of the active material layers having film thicknesses of 0.1 to 1 nm are improved. When comparing Comparative Example 2 and 4 with Example 1, it was found that the crystalline orientation of each magnetic recording layer was improved and, as a result, the electromagnetic conversion characteristics were improved, by opening the gate between the magnetic recording layer chamber and the active material layer chamber. In Example 1, the SNR characteristics of the active material layer having a film thickness of 15 nm were not improved. It is considered because the function of the underlayer that improves the crystalline orientation of the magnetic recording layer is lowered when the thickness of the active material layer is too thick. Moreover, in Example 2, the SNR characteristics were not improved when the film thicknesses of the active material layers were as thick as 2 nm and 5 nm. This is due to the decrease in signal intensity caused by the increase in the distance between the magnetic recording layer and the head.

It was also found that the same effects as those of Examples were achieved by the manufacturing method that has a step of forming the active material layer while forming the magnetic recording layer in the same chamber.

As described above, the present invention can obtain a magnetic recording medium with improved crystalline orientation of a magnetic recording layer and thus excellent electro-magnetic characteristics.

What is claimed is:

1. A method for manufacturing a magnetic recording medium, the method comprising:
    providing film-forming equipment that includes a plurality of chambers that perform independent film formation processes, the chambers including an active material layer chamber and a magnetic recording layer chamber adjacent the active material layer chamber;
    coupling the plurality of chambers together so that the active material layer chamber and the magnetic recording layer chamber are coupled together through a gate;
    forming an active material layer in the active material layer chamber, the active material layer composed of a compound containing any one of TiN, SrTiO$_3$ or BaTiO$_3$ as a main component;
    controlling gaseous communication between the plurality of chambers by opening the gate so that gas is communicated from the active material layer chamber to the magnetic recording layer chamber, while both
        preventing gaseous communication between the active material layer chamber and any other chamber except the magnetic recording layer chamber, and
        preventing gaseous communication between the magnetic recording layer chamber and any other chamber except the active material layer chamber; and
    concurrently with the controlling, forming a magnetic recording layer on the active material layer in the magnetic recording layer chamber.

2. The method for manufacturing a magnetic recording medium according to claim 1, wherein the magnetic recording layer includes Co having a hexagonal close-packed structure.

3. The method for manufacturing a magnetic recording medium according to claim 2, wherein in the forming an active material layer, the active material layer is formed to have a film thickness of 0.1 to 10 nm.

4. The method for manufacturing a magnetic recording medium according to claim 1, wherein the magnetic recording layer includes a main component having CoPt with a L10-ordered structure or FePt with a L10-ordered structure.

5. The method for manufacturing a magnetic recording medium according to claim 4, wherein in the forming an active material layer, the active material layer is formed to have a film thickness of 0.1 to 10 nm.

6. The method for manufacturing a magnetic recording medium according to claim 1, wherein in the forming an active material layer, the active material layer is formed to have a film thickness of 0.1 to 10 nm.

7. A method for manufacturing a magnetic recording medium, comprising:
    providing a multi-layer chamber configured to form only an active material layer and a magnetic recording layer, the active material layer and the magnetic recording layer being formed at film forming positions in the multi-layer chamber and in gaseous communication with each other;
    forming the active material layer in said multi-layer chamber at a first of the film forming positions, the active material layer composed of a compound containing any one of TiN, SrTiO$_3$ or BaTiO$_3$ as a main component; and
    forming the magnetic recording layer on the active material layer in said multi-layer chamber at a second of the film forming positions, and the first and the second film forming positions are in the same multi-layer chamber.

8. The method for manufacturing a magnetic recording medium according to claim 7, wherein the magnetic recording layer includes Co having a hexagonal close-packed structure.

9. The method for manufacturing a magnetic recording medium according to claim 8, wherein in the forming the active material layer, the active material layer is formed to have a film thickness of 0.1 to 10 nm.

10. The method for manufacturing a magnetic recording medium according to claim 7, wherein the magnetic recording layer includes a main component having CoPt with a L10-ordered structure or FePt with a L10-ordered structure.

11. The method for manufacturing a magnetic recording medium according to claim 10, wherein in the forming the active material layer, the active material layer is formed to have a film thickness of 0.1 to 10 nm.

12. The method for manufacturing a magnetic recording medium according to claim 7, wherein in the forming the active material layer, the active material layer is formed to have a film thickness of 0.1 to 10 nm.

13. A method for manufacturing a magnetic recording medium, the method comprising:
    providing film-forming equipment that includes a plurality of chambers that perform independent film formation processes, the chambers including an active material layer chamber and a magnetic recording layer chamber adjacent the active material layer chamber;
    coupling the plurality of chambers together so that the active material layer chamber and the magnetic recording layer chamber are coupled together through a gate;
    forming a magnetic recording layer in the magnetic recording layer chamber;
    controlling gaseous communication between the plurality of chambers by opening the gate so that gas is communicated from the active material layer chamber to the magnetic recording layer chamber while both
        preventing gaseous communication between the active material layer chamber and any other chamber except the magnetic recording layer chamber, and
        preventing gaseous communication between the magnetic recording layer chamber and any other chamber except the active material layer chamber; and
    concurrently with the controlling, forming an active material layer on the magnetic recording layer in the active material layer chamber, the active material layer composed of a compound containing any one of TiN, SrTiO$_3$ or BaTiO$_3$ as a main component.

14. The method for manufacturing a magnetic recording medium according to claim 13, wherein in the forming an active material layer, the active material layer is formed to have a film thickness of 0.1 to 1 nm.

15. The method for manufacturing a magnetic recording medium according to claim 13, wherein in the forming an active material layer, the active material layer is formed to have a film thickness of 0.1 to 1 nm.

16. A method for manufacturing a magnetic recording medium, comprising:

providing a multi-layer chamber configured to form only an active material layer and a magnetic recording layer, the active material layer and the magnetic recording layer being formed at film forming positions in the multi-layer chamber and in gaseous communication with each other;

forming the magnetic recording layer in said multi-layer chamber at a first of the film forming positions;

moving the magnetic recording layer to a second of the film forming positions which is different from the first film forming position, the first and second film forming positions being in the same multi-layer chamber; and forming the active material layer on the magnetic recording layer in said multi-layer chamber at the second film forming position, the active material layer composed of a compound containing any one of TiN, $SrTiO_3$ or $BaTiO_3$ as a main component.

17. The method for manufacturing a magnetic recording medium according to claim 16, wherein in the forming the active material layer, the active material layer is formed to have a film thickness of 0.1 to 1 nm.

18. The method for manufacturing a magnetic recording medium according to claim 16, wherein in the forming the active material layer, the active material layer is formed to have a film thickness of 0.1 to 1 nm.

* * * * *